(12) United States Patent
Domeier et al.

(10) Patent No.: US 11,834,217 B2
(45) Date of Patent: Dec. 5, 2023

(54) MODULAR TREATMENT APPARATUS FOR CONTAINERS

(71) Applicant: KRONES AG, Neutraubling (DE)

(72) Inventors: Bernhard Domeier, Pentling (DE); Benedikt Boettcher, Bruckmühl (DE); Eduard Handschuh, Donaustauf (DE); Klaus Voth, Obertraubling (DE)

(73) Assignee: KRONES AG, Neutraubling (DE)

( * ) Notice: Subject to any disclaimer, the term of this patent is extended or adjusted under 35 U.S.C. 154(b) by 302 days.

(21) Appl. No.: 17/031,982

(22) Filed: Sep. 25, 2020

(65) Prior Publication Data
US 2021/0094718 A1 Apr. 1, 2021

(30) Foreign Application Priority Data
Sep. 30, 2019 (DE) .................. 10 2019 126 289.5

(51) Int. Cl.
| | |
|---|---|
| *B65B 59/04* | (2006.01) |
| *B05C 13/02* | (2006.01) |
| *B65B 55/02* | (2006.01) |
| *C23C 16/04* | (2006.01) |
| *C23C 16/54* | (2006.01) |

(52) U.S. Cl.
CPC .............. *B65B 59/04* (2013.01); *B05C 13/02* (2013.01); *B65B 55/02* (2013.01); *C23C 16/045* (2013.01); *C23C 16/54* (2013.01)

(58) Field of Classification Search
CPC ......... B67C 7/0006; B67C 3/22; B65B 55/02; B65B 59/04; B41J 3/40733; B05C 13/02; C23C 16/54; C23C 16/045; B05D 7/227; B65G 37/02; B65G 2207/30; B65G 54/02; B65G 47/842; B65G 2201/0244
See application file for complete search history.

(56) References Cited

U.S. PATENT DOCUMENTS

| | | | |
|---|---|---|---|
| 9,873,569 B1 | 1/2018 | Frohlich et al. | |
| 2013/0026005 A1 | 1/2013 | Senn | |
| 2016/0244271 A1* | 8/2016 | Walter | ................ B65G 47/715 |
| 2018/0009553 A1* | 1/2018 | Froehlich | .................. B67C 7/00 |

FOREIGN PATENT DOCUMENTS

| | | | | |
|---|---|---|---|---|
| DE | 10 2007 017646 A1 | 10/2008 | | |
| DE | 102016200223 A1 * | 7/2017 | ............ | B05B 12/18 |
| EP | 1 787 662 A1 | 5/2007 | | |
| EP | 2689933 A2 | 1/2014 | | |
| WO | WO-2009142198 A1 * | 11/2009 | ............ | A61L 2/186 |

\* cited by examiner

*Primary Examiner* — Thomas M Wittenschlaeger
(74) *Attorney, Agent, or Firm* — Schmeiser, Olsen & Watts, LLP (57) ABSTRACT

Provided is an apparatus for treating containers and in particular plastic containers having a container treatment unit, wherein the apparatus has a main transport device which is suitable and intended to transport the containers along a predetermined transport path, wherein the container treatment device has at least two treatment devices which are suitable and intended to treat the containers in a predetermined manner, having a feed and discharge unit which is suitable and intended to feed containers to be treated to the at least first treatment unit and to discharge containers already been treated from the first treatment device and having a media supply unit which is suitable and intended to feed media to the at least one first treatment unit.

10 Claims, 12 Drawing Sheets

MODULAR TREATMENT APPARATUS FOR CONTAINERS

CROSS-REFERENCE TO RELATED APPLICATION

This application claims priority to German Application No. 10 2019 126 289.5, having a filing date of Sep. 30, 2019, the entire contents of which are hereby incorporated by reference.

FIELD OF TECHNOLOGY

The following relates to an apparatus and a method for treating containers. The following is described with reference to the coating of plastic containers, in particular the coating of the inner wall of the plastic containers. However, it is pointed out that the following described here is also applicable to other different types for treating containers, such as for example sterilization devices. However, there are advantages emerging from embodiments of the invention which are in particular also applicable to coating devices.

BACKGROUND

A coating device is known from the conventional art which has a feed star, as well as a carrier wheel on which a plurality of coating stations is arranged which simultaneously transport and coat the containers. These apparatuses implicate certain disadvantages. On the one hand, a maintenance of individual coating stations is not possible without stopping the plant as a whole.

Furthermore, such plants also do not allow an increase of capacity or a variable adaption of the capacity. Embodiments of the invention are therefore based on the object to propose an apparatus and a method which in particular also enable a variable increase of such plants. This is achieved according to embodiments of the invention by the subject matters of the independent claims. Advantageous embodiments and further developments are the subject of the dependent claims.

An apparatus according to embodiments of the invention for treating containers and in particular plastic containers has a container treatment unit, wherein the apparatus has a main transport device which is suitable and intended to transport the containers along a predetermined transport path and wherein the first container treatment unit has at least one treatment device and at least two treatment devices which are suitable and intended to treat the containers in a predetermined way.

Furthermore, die apparatus has a feed unit and a discharge unit, which are suitable and intended to feed containers to be treated at least to the first container treatment unit and to discharge containers already been treated from the first container treatment unit. Additionally, the apparatus has a media supply unit which is suitable and intended to feed media at least to the first treating unit and/or to discharge a medium, such as in particular air, from the first treating unit.

According to embodiments of the invention the apparatus is modular and freely expandable and/or changeable and at least one further container treatment device can be added which treats the containers in the predetermined way and which has a transport device which is suitable and intended to transport the containers along a predetermined transport path, as well as at least two treatment stations which are suitable and intended to treat the containers in a predetermined way.

It is therefore proposed that the plant is modular and/or freely expandable and can be supplemented by a further treatment device, in order to increase for example the capacity in this way.

Hereafter, the term apparatus for treating containers is used for the whole plant. This apparatus has a treatment unit which in turn can have one or more treatment units. The treatment units in turn have at least one and a plurality of treatment stations. These treatment stations have, as mentioned above, also one transport device each, which feed the containers to the individual treatment stations.

Hence, in particular the amount of treatment devices is changeable and/or adaptable.

The main transport device is adaptable at least concerning one characteristic, in particular in order to adapt the apparatus to different numbers of treatment devices.

In particular, the first container treatment device and the second container treatment device are devices of the same type which implement basically the same treatment processes, such as for example coating processes.

In a further embodiment, each the feed unit and the discharge unit on the one hand and the media supply unit on the other hand are retained. In particular, the media can for example be chemicals which the plastic containers are provided with. Also, the media can be a negative pressure, that means in this case the media supply unit provides the containers with a negative pressure or air is discharged from the containers. Within the scope of the present application, therefore media is in particular understood to be substances but not electric energy for instance.

The treatment devices itself can optionally be coupled to the main transport device, in order to be able to change the productive capacity of the plant. In a further particular embodiment, the main transport device transports the containers continuously. The feed unit and the discharge unit leads the containers in particular to the main transport device.

In a further particular embodiment, the treatment device is arranged spatially between the supply unit and the media supply unit. In this way, a particularly efficient system layout can be reached.

Here, a front side can for example be provided which has a display device and in particular a touch panel.

The feed unit and the discharge unit can for example have one or two or also several transport stars which serve for feeding the containers to the main transport device.

In a further embodiment, the feed unit and the discharge unit are also suitable and intended to feed containers to be treated to the further treatment device and to discharge already treated containers from the further treatment device. This means that the feed unit and the discharge unit is also used to feed the further treatment devices.

In a further embodiment, the media supply unit is intended to feed media to the further treatment device, wherein, as mentioned above, media can also be taken to mean a vacuum application, that means in the physical sense the extraction of media—that is to say the extraction of air.

In a further embodiment, the media supply unit is suitable and intended to feed several and/or different media to the treatment units.

In a further embodiment, the container treatment devices are connected in series and/or in parallel relative to the transport path of the containers. This means that several treatment devices of this type can be arranged one after the other along the transport path of the containers. In the case of a parallel transport, a transport path can be split up into two (sub-)paths.

In a further embodiment, the treatment device has a treatment transport device which transports the containers and wherein the containers are able to be handed over from the main transport device to one of the treatment devices by the transport device in order to be treated, and the containers are in particular able to be handed over to the main transport device again after they have been treated by the treatment device. This container transport device can for example be a moveable and/or rotatable carrier.

In a further embodiment, the treatment transport device is suitable and intended to transport the containers in a clocked manner. In a further embodiment, individual treatment stations of the treatment unit are designed to be stationary. This means that the treatment process, for example a coating process, is particularly performed in a position of the containers standing upright (relative to the transport path). Here, it is again possible for a plurality of containers to be taken from the main transport device, and subsequently to be delivered to standing treatment stations and to be treated, for example to be coated, at this place. As mentioned above, the main transport device is particularly suitable and intended to transport the containers continuously.

In further embodiment, the treatment device can have at least three, at least four treatment stations. The treatment device has one of at maximum 20, at maximum 18, at maximum 16, at maximum 14 and at maximum 10 treatment stations.

In a further embodiment, the treatment devices are selected from a group of treatment devices which contains coating devices for coating walls for the containers, printing devices for printing the containers, sterilization devices for sterilization of containers, filling devices for filling containers, closing devices for closing containers and the like. The containers are, as mentioned above, plastic containers, however, it would also be conceivable to coat glass containers.

In a further embodiment, the apparatus has a container turning device which is suitable and intended to turn over the containers to be transported. In this way, it is possible for example to deliver the containers with its opening facing upwards to the feed and discharge device, however, the main treatment process is performed in an upside down condition of the containers, that means, in a condition in which the opening of the containers is facing downwards (that means nearer to the earth's center).

In an embodiment, the mentioned container turning device is part of the feed and discharge unit. That means, when expanding the plant, this turning device is retained and not modified. However, it is likewise possible for the container turning device not to be part of the feed and discharge unit, but to only deliver the containers to the latter.

In this way, it is possible for example that the turning device is also designed to be a circulating and transport means or transport or transporter, such as a circulating chain. The latter can here also be arranged in a horizontal manner and can in this way enable turning of the containers.

It would also be possible that the turning device has a linear motor drive device and in particular a long stator (linear motor) which also is arranged in a horizontal manner. In this way it would be possible that a chain or a suchlike long stator is for example designed to be oval-shaped, and spatially runs for example like a vehicle track, for example like a tank track. In this way, it is particularly easy to turn the containers.

In a further embodiment, the apparatus has a pitch changing device which is suitable and intended to change the pitch of two containers being arranged one after the other in the transport direction. Here, this pitch changing device can likewise be part of the above-mentioned feed and discharge unit.

In a further embodiment, at least one treatment device and/or treatment station and all of the treatment devices and/or treatment stations are arranged to be perpendicular relative to the transport path of the containers. This treatment unit may for example be arranged above or below the transport path of the containers. Furthermore, it is possible here that at least one treatment unit is moving basically perpendicularly relative to the transport path of the containers. This can be for example an element that is able to be introduced into the containers through a mouth of the containers.

In this way, for example a coating module can be arranged in a right angle relative to the mentioned transfer path.

In a further embodiment, the treatment devices have (gas) lances in the form of coating devices which are able to be introduced into the containers. Furthermore, the treatment devices also have igniters, such as in particular ignition electrodes. Here, a glass lance and at least an ignition electrode form an independent unit.

Furthermore, media feeding is also provided in order to supply coating media to the mentioned gas lance.

The treatment device has an elongated, rodlike element, in particular a lance. This lance has openings. A fluid medium can be introduced through these openings into the containers. This fluid medium is a gas being suitable for a plasma process. It is desirable for this gas to be a mixture of a siliceous precursor and oxygen, in particular for a PECVD (=plasma enhanced chemical vapor deposition) with silicon oxide. However, other kinds of gases are also conceivable, for example acetylene for the deposition of so-called DLC coatings. For a plasma sterilization it is possible to introduce for example argon and water vapor into the containers.

In a further embodiment, the coating device or the coating modules have vacuum pumps. Additionally, there are also drives provided which move for example a lance into the containers. In the case of a coating apparatus it is possible to switch off vacuum pumps, drives for coating lances and pumps for the coating gas.

In a further embodiment, at least one transport device and in particular the main transport device transports the containers at least sectionally along a transport path which deviates from a circular segment course or has a course which deviates from a circular segment-shaped course. While in the state of the art normally transport wheels are used, it is proposed here that the transport path has a different curvature progression. In this way, the transport path can have for example straight sections or also curved sections.

This transport path can be formed as an oval, that means having two rectilinear path sections and two diverting regions.

In a further embodiment, at least one transport device has a circulating transport means or transport or transporter and in particular a transport chain or a long stator.

Here, this transport means or transport or transporter is aligned horizontally.

BRIEF DESCRIPTION

Some of the embodiments will be described in detail, with reference to the following figures, wherein like designations denote like members, wherein.

DETAILED DESCRIPTION

Figure 1:
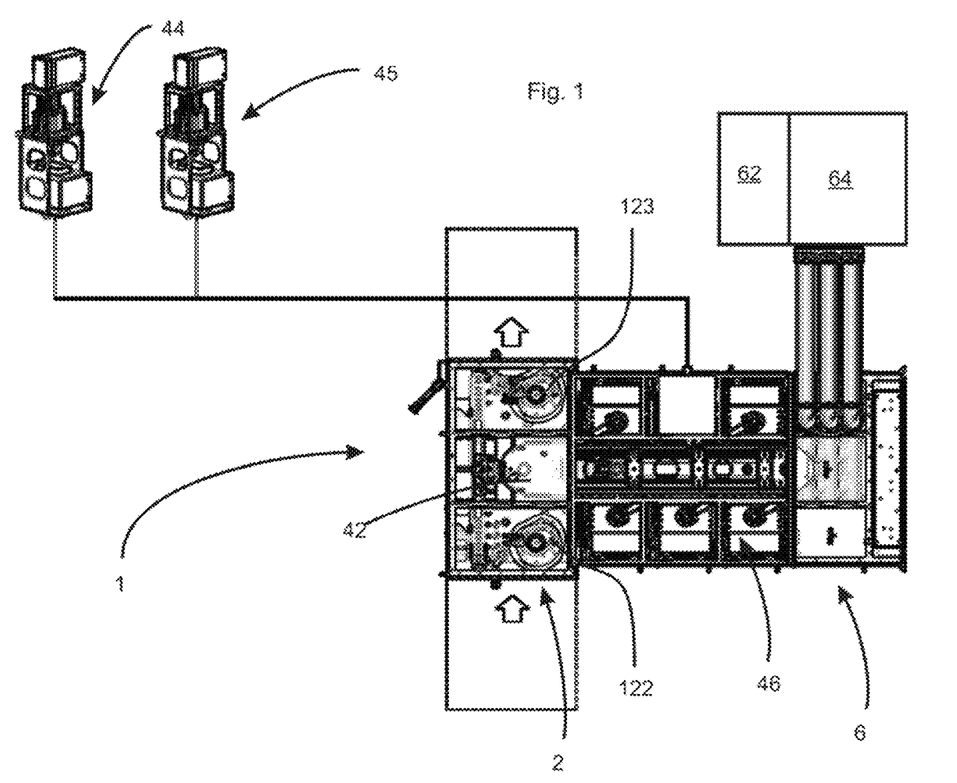
FIG. 1 shows a schematic depiction for illustration of the concept based on embodiments of the invention.

FIG. 1 shows a depiction for illustration of embodiments of the invention. Here, the reference numeral 1 relates to the apparatus as a whole. The latter has a feed unit and discharge unit 2 for the containers. This feed and discharge unit can have a first transport device 12, in particular a first transport star 122 and a second transport device 123, in particular a second transport star 123. By the first transport star the containers are conveyed to the apparatus and the containers (which are already treated if applicable) are discharged by the second transport device 123.

Reference numeral 42 indicates a main transport device which on the one hand takes over the containers from a transport star 122 and in turn passes them on to a transport star 123. This main transport device also protrudes into the fed and discharge unit 2 and extends into a container treatment unit 4. The containers can be removed from the individual treatment devices by this main transport device 42 for the purpose of being treated.

For this purpose, the main transport device 42 has a plurality of holding elements which are used to hold and transport the individual containers. The containers are here transported in series.

The feed star 122 and the discharge star 123 also have a plurality of holding devices, in order to transport the containers individually.

Furthermore, it is also possible that one of or both transport devices 122, 123 are formed as so-called pitch devices which are suitable and intended to change a distance or a pitch of the transported containers. In this way, different pitches can be set.

The main transport device 42 can here be formed as a circulating chain on which the individual holding devices are arranged for holding the containers. It would however also be possible that the main transport device, as mentioned above, can be formed as a long stator or as a linear motor drive.

Reference numerals 44, 45 and 46 indicate individual treatment stations. These treatment stations 44, 45, 46 in turn have each one container transport device 44b, 45b, 46b, such as a rotatable carrier which is used to transport the containers into the respective treatment stations. The treatment stations per se are arranged to be stationary, that means that the containers are forwarded to the treatment stations for treatment purposes. These individual container transport devices transport the containers in a clocked manner.

Reference numeral 6 indicates a media supply unit. The latter can on the one hand supply the containers with a negative pressure or a vacuum and also for example with a plasma for coating the containers. For this purpose, reference numeral 62 indicates a vacuum pump stand and reference numeral 64 a chemical stand.

As mentioned individually, the number and arrangement of the container treatment devices 44, 45, 46 can be changed, in order to change in this way the production capacity of the plant.

Figure 2:
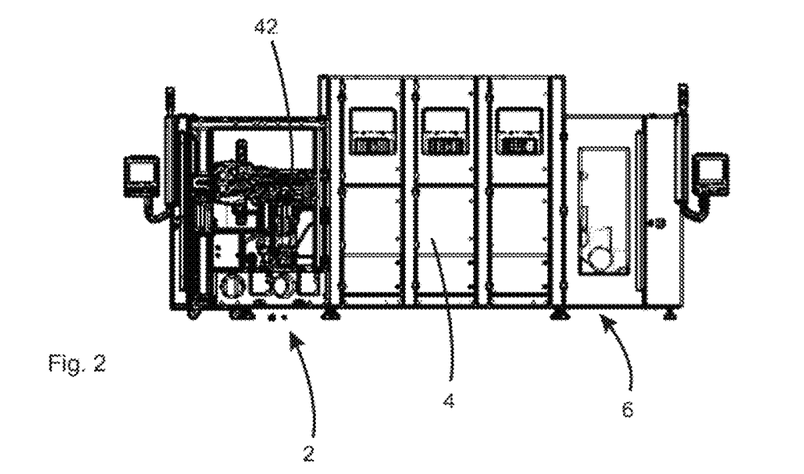
FIG. 2 shows an apparatus according to embodiments of the invention.

It is also possible that the main transport device 42 is of a modular design, with the result that in this way for example the transport path of the main transport device 42 can be changed. For this purpose, several modules can be introduced when providing a chain and a respective transport chain can likewise be extended. If the main transport device has a long stator, additional long stator elements can also be integrated here, in order to change the transport path. FIG. 2 shows a side view of an apparatus according to embodiments of the invention. Here again, a feed and discharge unit 2 together with the main transport device 42 is depicted, the actual treatment unit 4 having a plurality of treatment devices and the media supply unit 6.

Figure 3:
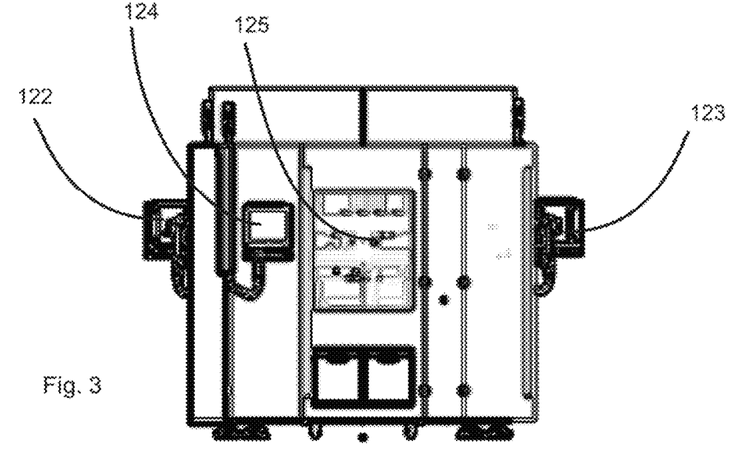
FIG. 3 shows a side view of the apparatus shown in FIG. 2.

FIG. 3 shows a side view of the apparatus according to embodiments of the invention. Here again, the feed star 122 and the discharge star 123 are recognizable, as well as an observation window 125 through which the user can observe the plant operation.

Reference numeral 124 indicates an operation device, such as a touch screen, in order to operate the apparatus.

Figure 4:
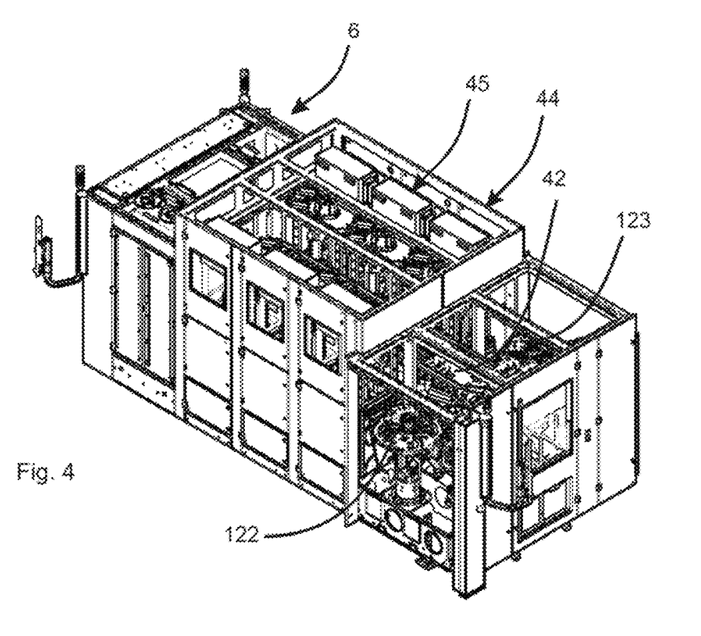
FIG. 4 shows a perspective depiction of the apparatus shown in FIG. 2.

FIG. 4 shows a perspective view of an apparatus according to embodiments of the invention. Here again, the feed star 122 as well as the discharge star 123 are recognizable which hand over the containers to the main transport device 42. It is recognizable that the treatment unit 4 together with the individual treatment units 44, 45, . . . is arranged between the feed and discharge unit 2 and the media supply unit 6. In this way, as a whole, a relatively compact design of the entire plant can be reached.

Figure 5:
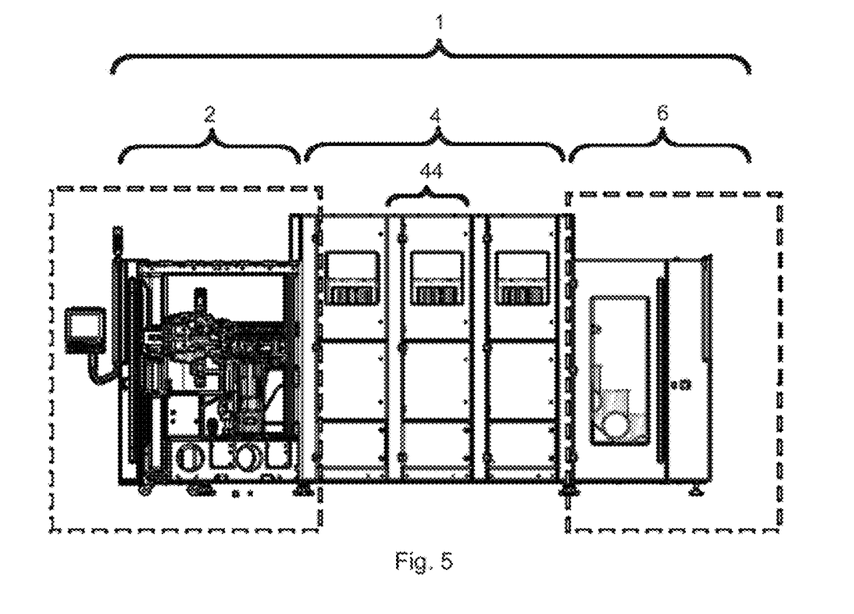
FIG. 5 shows a further depiction for illustration of the concept based on embodiments of the invention.

FIG. 5 shows a further depiction of the apparatus 1 according to embodiments of the invention. Here again, the segments of the feed and discharge unit 2, the treatment unit 4 and the media supply unit 6 are recognizable. Here, an individual treatment device 44 is also depicted. It can be seen that between the feed and discharge unit 2 and the media supply unit 6 it is possible for several or different numbers of treatment devices 4 to be introduced. In this way, the plant can for example be extended.

Figure 6:
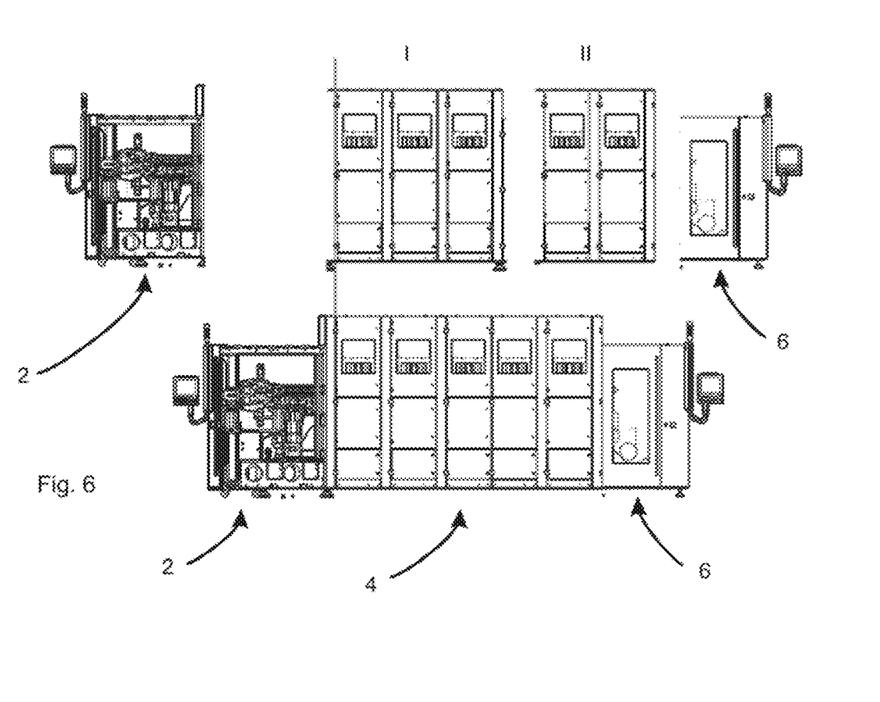
FIG. 6 shows a depiction of the apparatus with an increased number of treatment devices.

FIG. 6 illustrates this situation. Here, a block I is depicted which has here six treatment devices (of which three are not visible), as well as a second treatment block II which can be introduced into the plant, with the result that altogether ten treatment devices are provided, as shown in the lower partial image of FIG. 6. As mentioned above, the transport length of the main transport device 42 has to be changed in this case.

Figure 7:
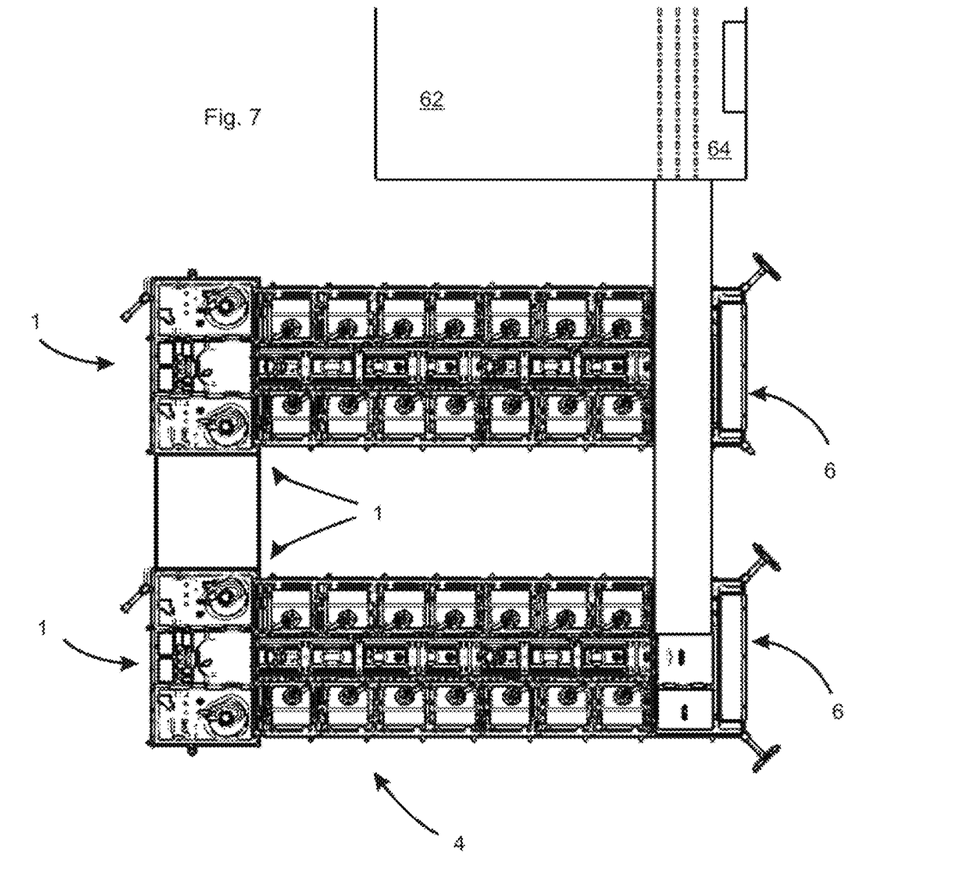
FIG. 7 shows a depiction for illustration of an apparatus having a further increased number of treatment devices.

FIG. 7 shows a further possible arrangement of an apparatus according to embodiments of the invention. In this embodiment, two apparatuses 1 are provided which respectively have own feed and discharge units 2 as well as treatment units 4. Here, two media supply units 6 are provided as well which, however, are mutually supplied by the respective reservoirs, that means by the pump stands 62 for the vacuum and 64, that means the plasma supply.

FIGS. 8a to 8e show different arrangements for apparatuses according to embodiments of the invention. It is pointed out, however, that the embodiments are not limited to the possibilities shown in these figures. In the procedure shown in FIG. 8a, two apparatuses 1 are provided which respectively have feed and discharge units 2, treatment units 4 and media supply units 6. However, they can be supplied with containers by a mutual transport device, wherein this mutual transport device can also be a turning device or can have one, which turns the containers, for example for the treatment thereof with its opening being aligned downwards.

Figure 8A:
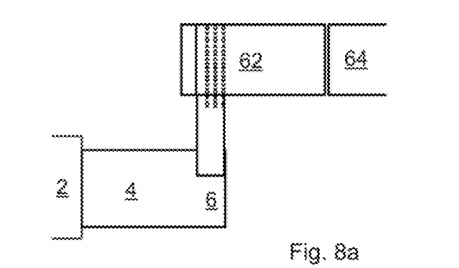
FIG. 8a shows a first construction concept for an apparatus according to embodiments of the invention.
Figure 8B:
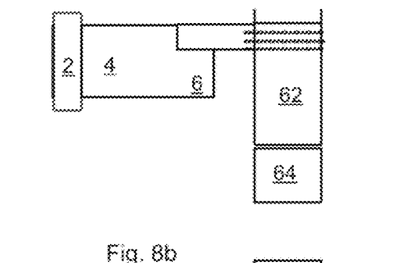
FIG. 8b shows a second construction concept for an apparatus according to embodiments of the invention.

FIG. 8b shows a further embodiment, wherein here the arrangement of the respective reservoirs for the media is modified, in order to, for example, reach an adaption to other spatial conditions.

Figure 8C:
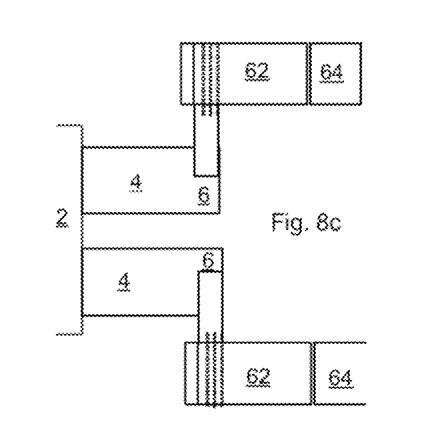
FIG. 8c shows a third construction concept for an apparatus according to embodiments of the invention.

FIG. 8c shows a further embodiment of an apparatus according to embodiments of the invention. In this embodiment, a mutual feed and discharge unit 2 is provided which supplies two separated container treatment devices 4. Additionally, two media supply units 6 are provided here as well.

Figure 8D:
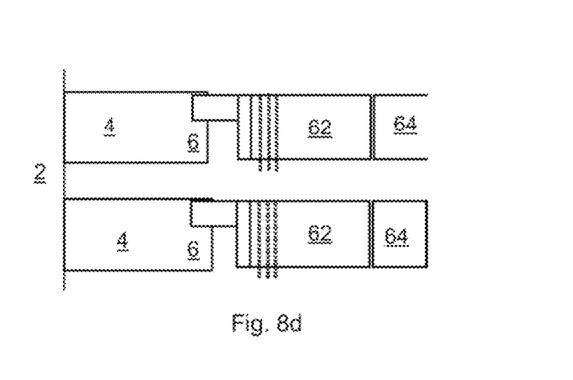
FIG. 8d shows a fourth construction concept for an apparatus according to embodiments of the invention.

In the embodiment shown in FIG. 8d, a mutual feed and discharge unit 2 is likewise provided which supplies the two separated container treatment devices 4. However, the spatial arrangement is here again modified.

Figure 8E:
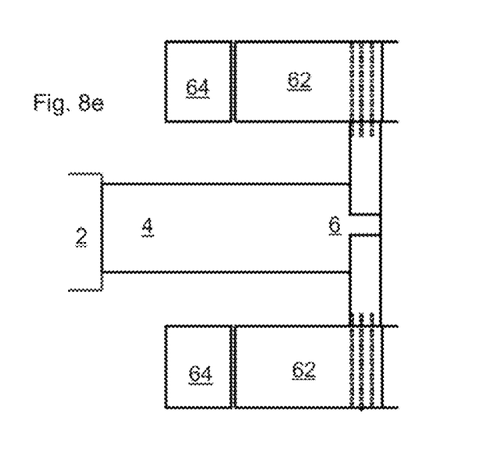
FIG. 8e shows a fifth construction concept for an apparatus according to embodiments of the invention.

In the embodiment shown in FIG. 8e, a feed and discharge unit 2 is provided which supplies a treatment unit 4 with a high number of container treatment devices. Due to the high number of container treatment devices there are two reservoirs or if applicable also two media supply units provided here.

It can be seen that the apparatus as a whole can be adapted in particular depending on spatial conditions, in order to reach an output or a flow rate as desired by the customer.

Figure 9:
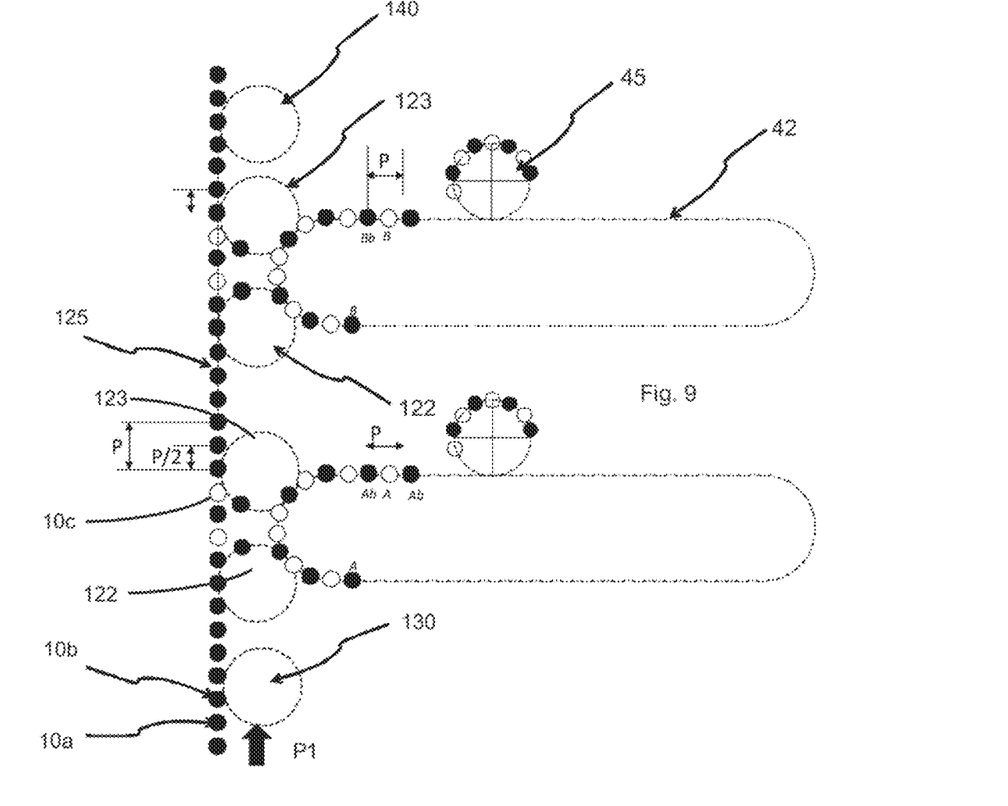
FIG. 9 shows a depiction for illustration of the transport of the containers.

FIG. 9 shows a schematic depiction of an arrangement having two main transport devices which, however, are supplied by a mutual inflow of containers 10 (arrow P1).

Here, the containers are alternatingly fed to the two main transport devices. Here, reference numeral 10a indicates a container which is fed to the lower main transport device 42 and reference numeral 10b indicates a container which is fed to the upper main transport device. Reference numeral 10c indicates a vacancy or an unoccupied holding device.

Reference numeral 130 indicates a feed device, in order to feed the containers to the whole treatment process and reference numeral 140 indicates a discharge device, in order to discharge the containers from the process. Reference numeral 125 indicates a turning device or a turning path along which the containers are turned.

Figure 10:
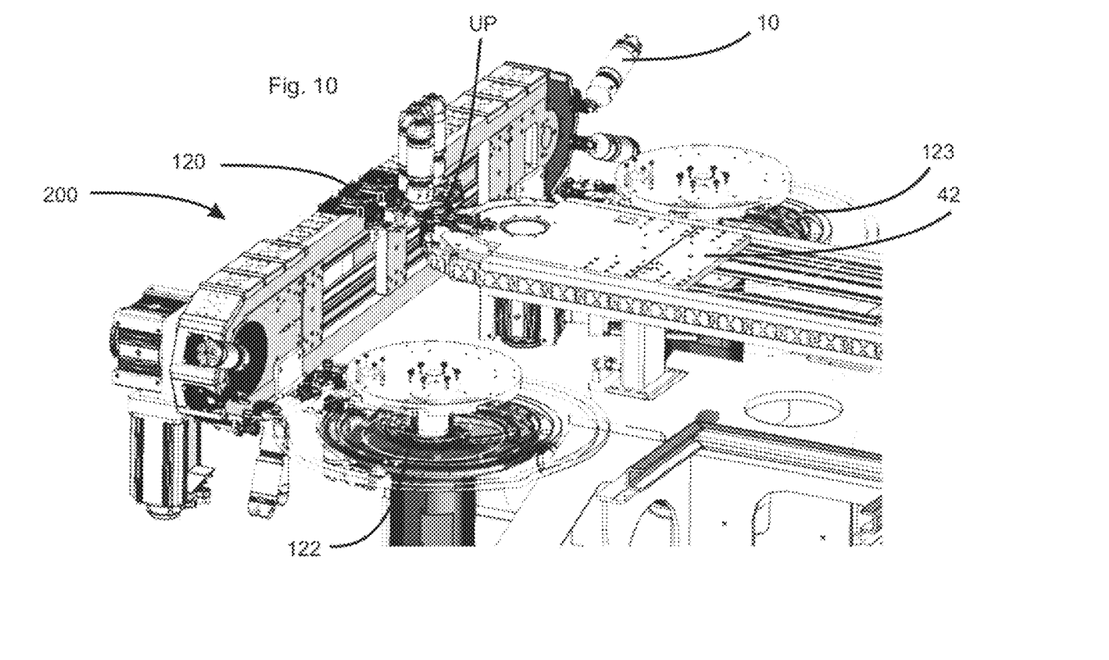
FIG. 10 shows a perspective depiction for illustration of the transport and the turning of the containers.

FIG. 10 shows a depiction of a second transport device 200 which is also a turning device. An infeed starwheel designed as a pitch star is recognizable which hands over the containers 10 in an upright position to the second transport device 200. The containers are moved upward over a curved section by the transport device 200. By way of this moving the containers 10 are automatically turned, so that they are conveyed in a turned position in the upper region of the second transport device 200.

At the handover point ÜP the containers 10 are handed over to the main transport device 42 by the second transport device 200. After the containers 10 have circulated the first transport device 42, the containers 10 are again handed over to the second transport device 200 at the handover point ÜP. The containers 10 are still in a turned position here, as such a position is desirable for coating. After the containers have been transported along a linear section of the transport device 200, they are transported downward along a curved section, whereby the containers 10 are again automatically turned into an upright position. The containers 10 are handed over in this upright position to the outlet star 123 which is designed as a pitch star.

Figure 11:
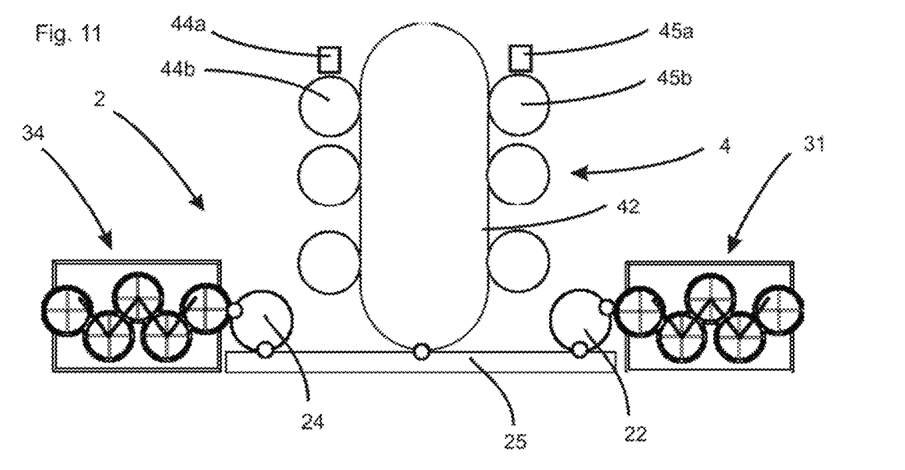
FIG. 11 shows a first embodiment of a treatment device according to embodiments of the invention.

FIG. 11 shows a first embodiment of a treatment device according to embodiments of the invention. The following figures are described only with reference to those elements which respectively deviate from the now described embodiment with reference to FIG. 11.

Reference numerals 31 and 34 indicate transport sections.

Reference numeral 2 indicates the feed and discharge unit for the containers. It is used to feed containers (not depicted) to the main transport device 42. Here, reference numerals 22 and 24 relate to the transfer devices, such as transfer stars. Reference numeral 25 indicates a turning device, such as in the form a chain, in order to turn the containers, that means in particular with their opening facing downwards in such a way that they are handed over to the main transport device 42 in this position. Reference numeral 4 indicates as a whole the one treatment unit.

Reference numerals 44 and 45 indicate two treatment devices which respectively can have treatment stations 44a, 45a or treatment elements.

Additionally, these treatment devices have each treatment transport devices 44b, 45b which transport the containers to the respective treatment stations.

In the embodiment shown in FIG. 11, the respective treatment stations, here the coating modules, are aligned in a right angle relative to the transfer path, that means that path along which the containers are transported by the main transport device 42.

The turning path 25 can, as mentioned above, be a chain and can be arranged horizontal. However, it is also possible that this turning path is a long stator and that it is likewise aligned to be horizontal.

In the embodiment shown in FIG. 11 the container is handed over on the transfer path in the middle of the turning device.

Figure 12:
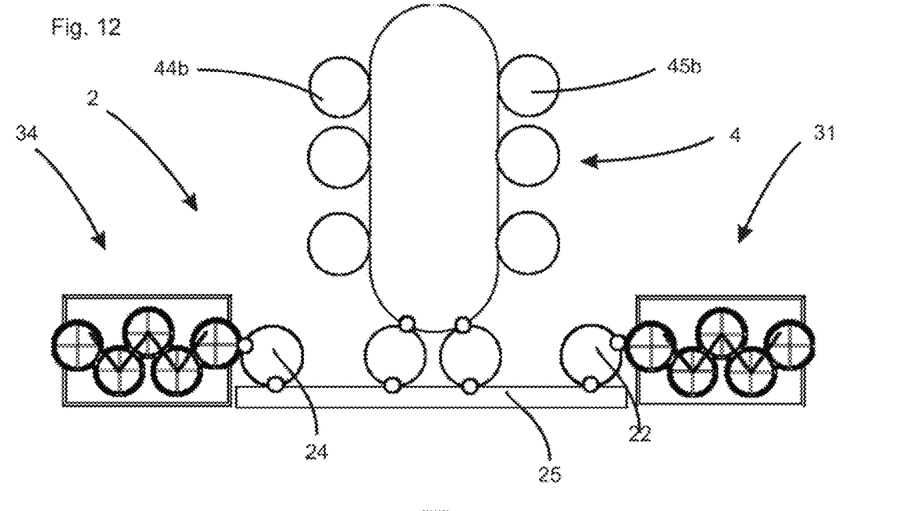
FIG. 12 shows a second embodiment of a treatment device according to embodiments of the invention.

FIG. 12 differs from FIG. 11 in that here two transfer stars are provided, in order to hand over the containers to the main transport device 42. These transfer stars are her particularly designed as pitch stars, that means as transport devices which are suitable and intended to change a pitch of successive plastic containers.

However, here as well, a chain is used as turning path.

Figure 13:
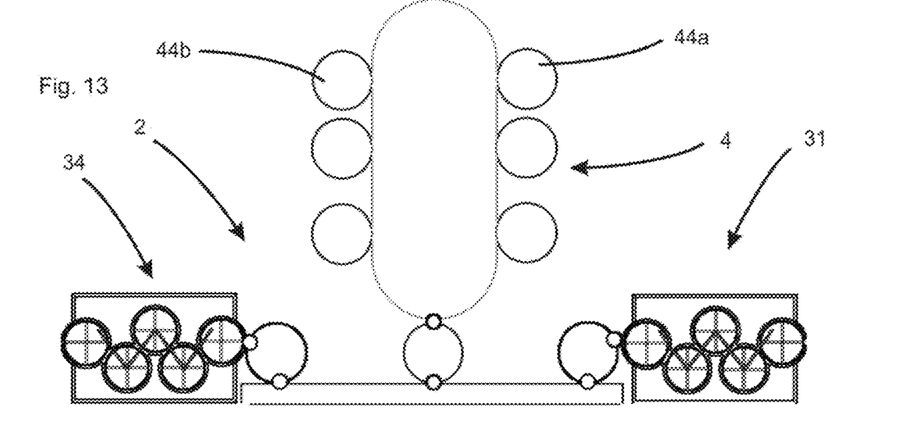
FIG. 13 shows a third embodiment of a treatment device according to embodiments of the invention.

In the embodiment shown in FIG. 13, only a transfer star is here provided in the middle, in order to hand over the containers from the turning device to the main transport device 42.

In the embodiment shown in FIG. 14, here again the coating modules are arranged in a right angle relative to the turning path and the coating modules are here arranged in a circular manner around the transfer path. The container transport device 44b is here a transport wheel.

Figure 14:
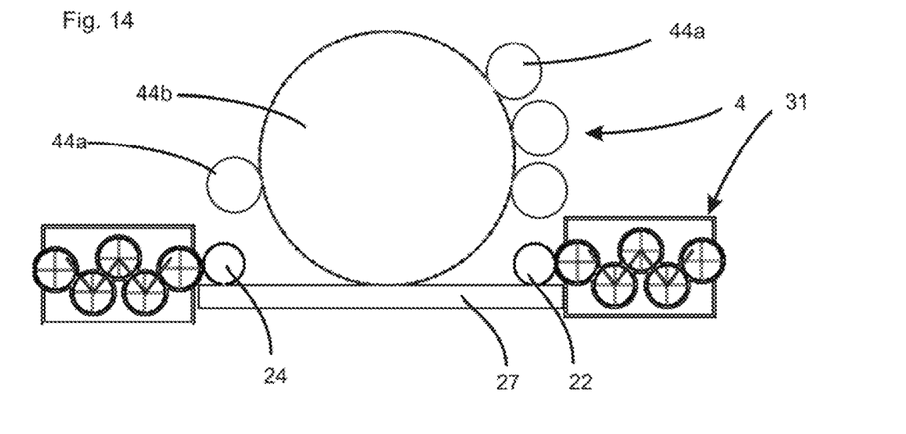
FIG. 14 shows a fourth embodiment of a treatment device according to embodiments of the invention.
Figure 15:
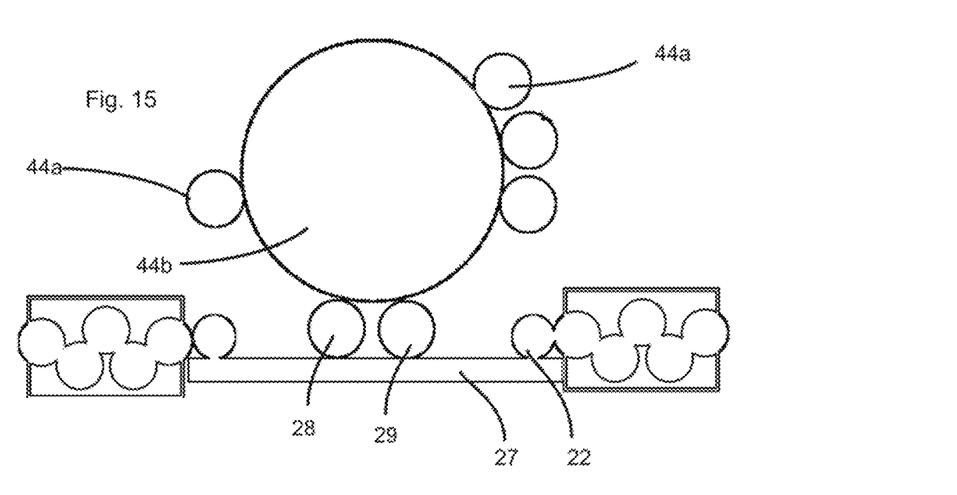
FIG. 15 shows a fifth embodiment of a treatment device according to embodiments of the invention.
Figure 16:
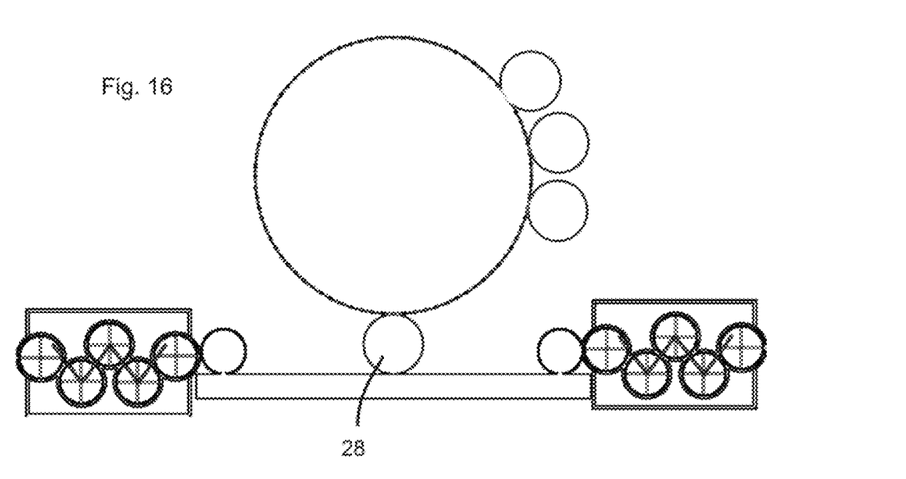
FIG. 16 shows a sixth embodiment of a treatment device according to embodiments of the invention.

In the embodiment shown in FIG. 14, the containers are directly handed over from the turning path to the transport wheel. In the embodiment shown in FIG. 15 again two transfer stars 28, 29 are provided and in the embodiment shown in FIG. 16 a transfer star 28.

Figure 17:
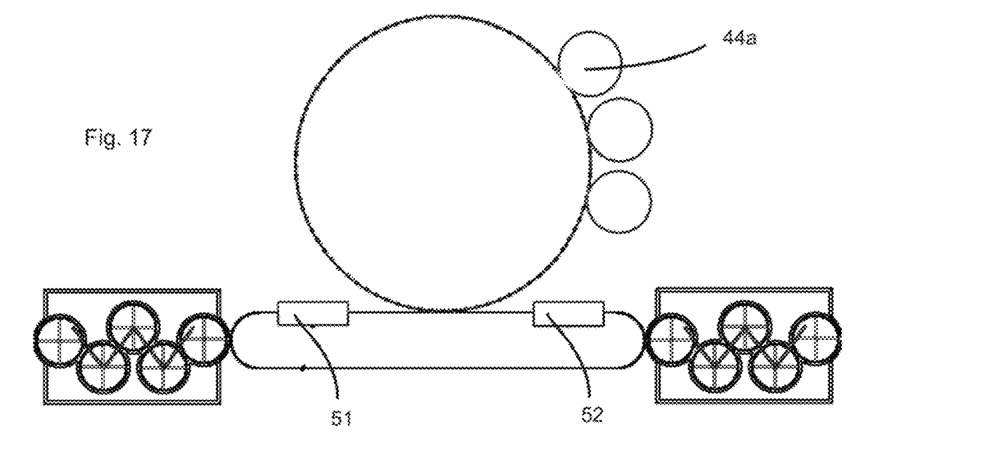
FIG. 17 shows a seventh embodiment of a treatment device according to embodiments of the invention.

FIG. 17 shows an embodiment in which likewise the coating module is arranged in a right angle relative to the transfer path and again in the middle a handing over of the containers is performed.

In this embodiment two turning devices 51 and 52 are provided which first of all turn the containers in such a way that they can be treated by the treatment device and afterwards are turned back again, that means into a position in which the opening protrudes upwards.

Figure 18:
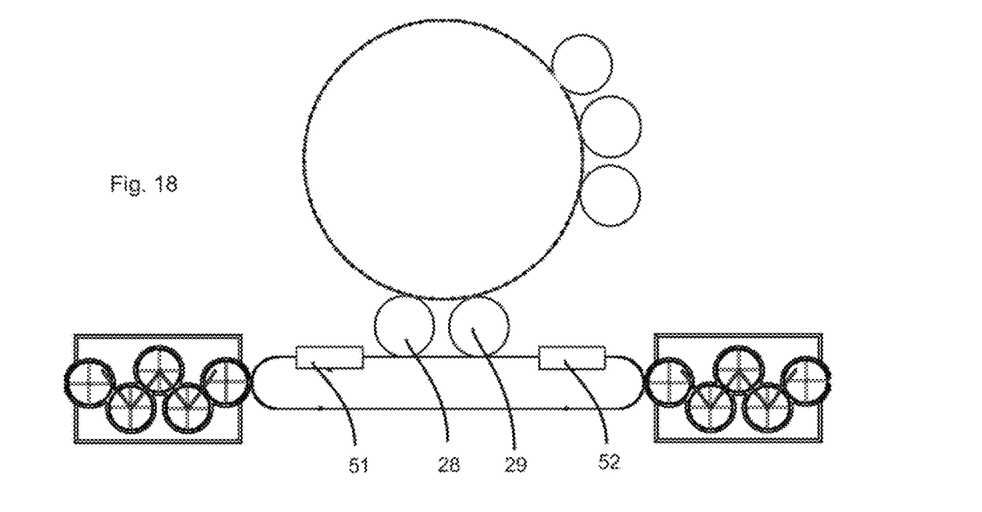
FIG. 18 shows a eighth embodiment of a treatment device according to embodiments of the invention.
Figure 19:
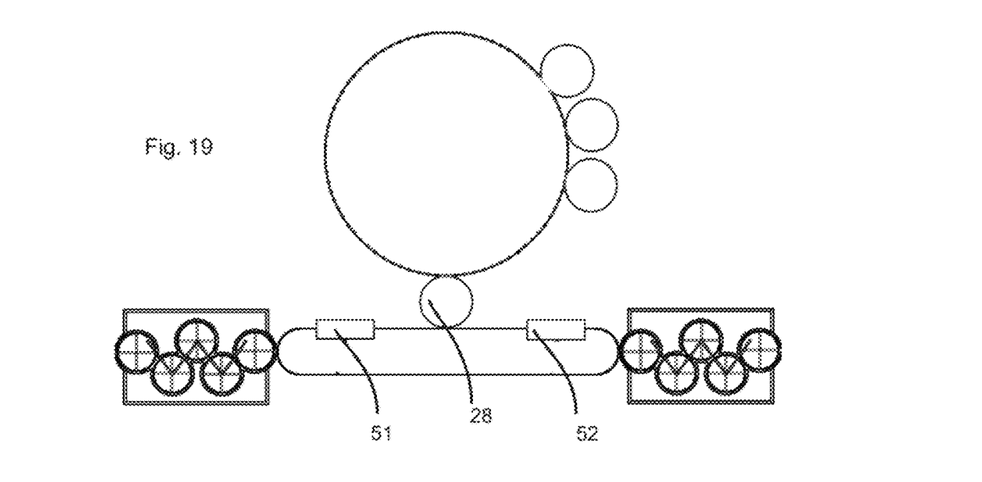
FIG. 19 shows a ninth embodiment of a treatment device according to embodiments of the invention.

The embodiment shown in FIG. 18 describes a similar circumstance, however, here having two transfer stars, while FIG. 19 shows one transfer star only.

Figure 20:
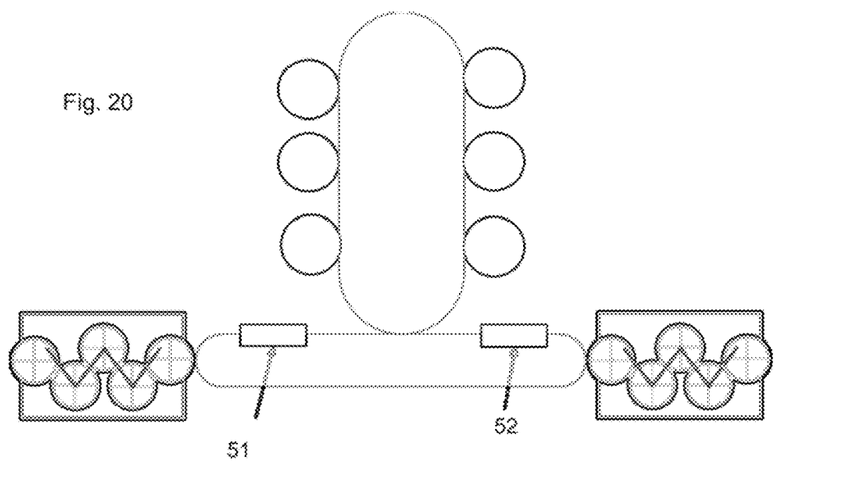
FIG. 20 shows a tenth embodiment of a treatment device according to embodiments of the invention.
Figure 21:
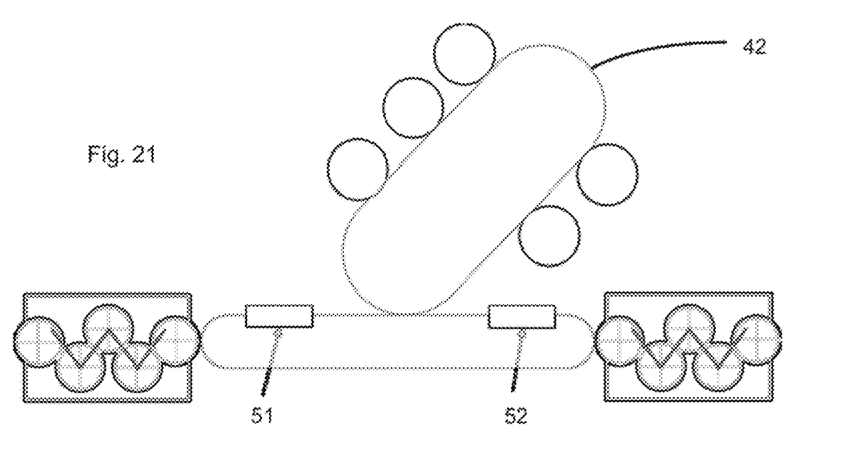
FIG. 21 shows a eleventh embodiment of a treatment device according to embodiments of the invention.
Figure 22:
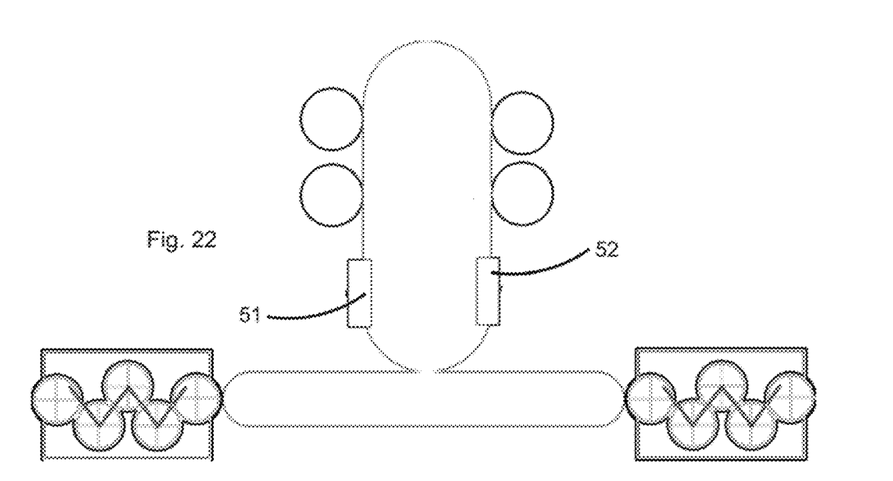
FIG. 22 shows a twelfth embodiment of a treatment device according to embodiments of the invention.

Again, in FIGS. 20 to 22 two turning devices 51, 52 are provided. However, the main transport device is in the embodiment shown in FIG. 21 arranged obliquely. In the embodiment shown in FIG. 22 the turning device 51, 52 are in the region of the main transport device 42.

Figure 23:
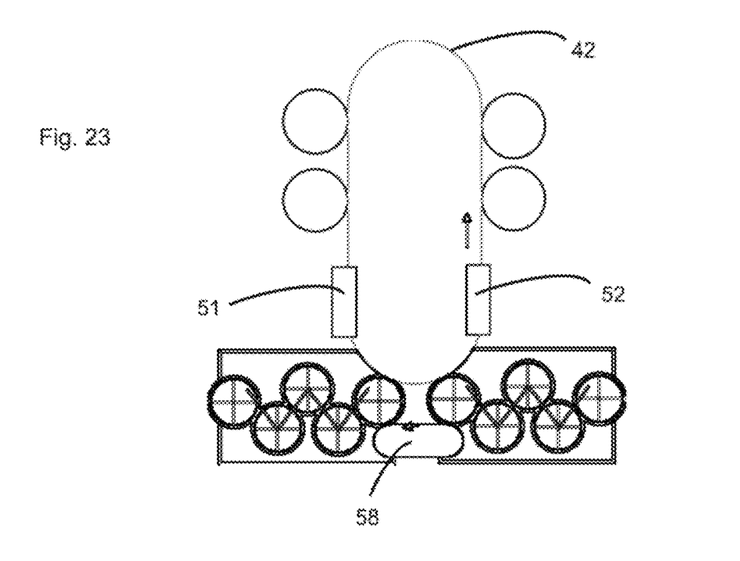
FIG. 23 shows a thirteenth embodiment of a treatment device according to embodiments of the invention.

In the embodiment shown in FIG. 23 the containers are turned on the transfer path or the main transport device 42 and upstream of the station S1 and downstream of the station Sn the containers are again turned back into their starting position.

The transfer path or the main transport device can also be a chain wheel and/or a long stator. In this embodiment the containers are handed over to the transfer path in a curve and the containers are received by the transport path in a curve. Additionally, in the embodiment shown here, a by-pass device 58 is provided via which it is possible to bypass the treatment device 4.

Figure 24:
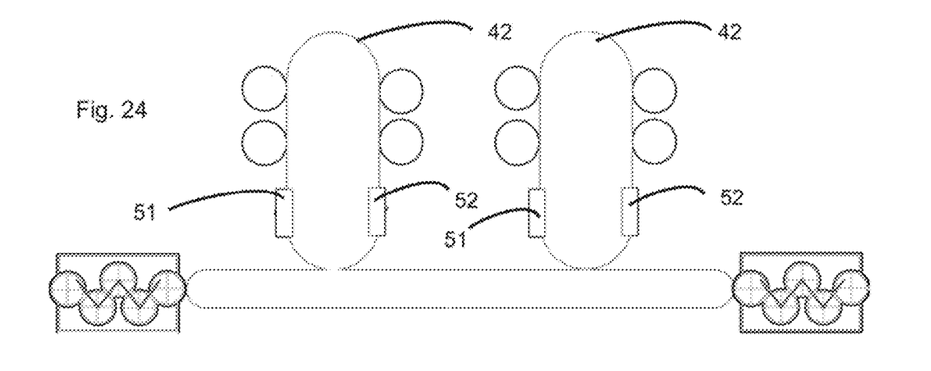
FIG. 24 shows a fourteenth embodiment of a treatment device according to embodiments of the invention.
Figure 25:
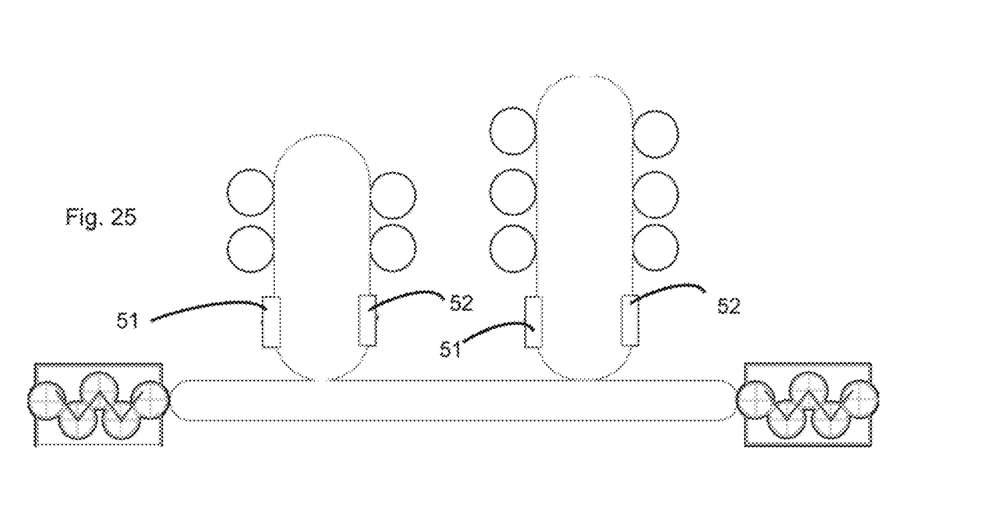
FIG. 25 shows a fifteenth embodiment of a treatment device according to embodiments of the invention.
Figure 26:
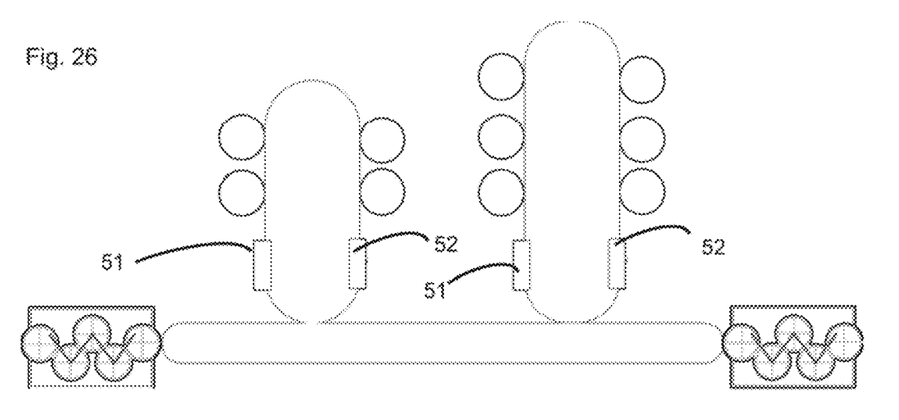
FIG. 26 shows a sixteenth embodiment of a treatment device according to embodiments of the invention.

In the situation shown in FIGS. 24 to 26 two treatment devices are depicted respectively which are arranged in series relative to the transport path of the containers.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

REFERENCE NUMERALS 1 apparatus
2 feed and discharge unit
4 container treatment unit
6 media supply unit
28 transfer star
29 transfer star
31 transport section
34 transport section
42 main transport device
44 treatment device
44a treatment station
44b container transport device
45 treatment device
45a treatment station
45b container transport device
46 treatment device
51 turning device
52 turning device
62 vacuum pump stand
64 chemical stand
64 reservoir
122 first transport star, feed star
123 second transport star, discharge star
124 operating device
125 observation window

The invention claimed is:

1. An apparatus for coating containers comprising:
a main transport device which is suitable and intended to transport the containers along a predetermined transport path,
a container treatment unit, wherein the container treatment unit has at least two container coating devices for coating a wall of the containers, which are suitable and intended to coat the containers in a predetermined manner,
a feed and discharge unit which is suitable and intended to feed containers to be coated to at least a first container coating device of the at least two container coating devices and to discharge containers already coated from the first container coating device, and
a media supply unit which is suitable and intended to feed media to at least the first container coating device,
wherein the apparatus is modular and/or freely expandable in such a way that at least one further container coating device can be added which has a treatment transport device which is suitable and intended to transport the containers along the predetermined transport path and has at least two coating stations which are suitable and intended to coat the containers in predetermined manner, and
wherein the apparatus has a container turning device suitable and intended to turn the containers, so that the containers are delivered with an opening facing upwards to the feed and discharge unit and the coating process is performed in an upside down condition of the containers in which the opening is facing downwards.

2. The apparatus according to claim 1, wherein the feed and discharge unit is also suitable and intended to feed containers to be coated to the further coating device and to discharge already coated containers from the further coating device and/or the media supply unit is suitable and intended to feed media to the further coating device.

3. The apparatus according to claim 1, wherein the at least two container coating devices are connected in series and/or in parallel relative to the transport path of the containers.

4. The apparatus according to claim 1, wherein the at least two container coating devices have a treatment transport device which transports the containers and wherein the containers are able to be handed over from the main transport device to one of the coating devices for the purpose of coating by the one of the coating devices and the containers are able to be handed over to the main transport device again, in particular after being coated by the coating device.

5. The apparatus according to claim 1, wherein the container treatment devices are for coating an inner wall of the containers.

6. The apparatus according to claim 1, wherein the apparatus has a pitch changing device which is suitable and intended to change a pitch of two containers being arranged one after the other in the transport direction.

7. The apparatus according to claim 1, wherein at least one container coating device of the at least two container coating devices is arranged to be perpendicular relative to the transport path of the containers.

8. The apparatus according to claim 1, wherein the treatment transport device and/or the main transport device transports the containers at least sectionally along a transport path which has a course which deviates from a circular segment-shaped course.

9. The apparatus according to claim 1, wherein the treatment transport device has a circulating transport means.

10. The apparatus according to claim 1, wherein the main transport device is designed to be segmented and/or is able to be changed with respect to its receiving capacity of containers.

* * * * *